United States Patent
Bomberger et al.

(10) Patent No.: US 12,237,420 B2
(45) Date of Patent: Feb. 25, 2025

(54) FIN SMOOTHING AND INTEGRATED CIRCUIT STRUCTURES RESULTING THEREFROM

(71) Applicant: Intel Corporation, Santa Clara, CA (US)

(72) Inventors: Cory Bomberger, Portland, OR (US); Anand S. Murthy, Portland, OR (US); Tahir Ghani, Portland, OR (US); Anupama Bowonder, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/643,632

(22) Filed: Apr. 23, 2024

(65) Prior Publication Data

US 2024/0274718 A1    Aug. 15, 2024

Related U.S. Application Data

(63) Continuation of application No. 18/143,549, filed on May 4, 2023, now Pat. No. 12,021,149, which is a continuation of application No. 16/700,826, filed on Dec. 2, 2019, now Pat. No. 11,682,731.

(51) Int. Cl.
*H01L 21/00* (2006.01)
*H01L 29/165* (2006.01)
*H01L 29/66* (2006.01)
*H01L 29/78* (2006.01)

(52) U.S. Cl.
CPC ........ *H01L 29/7853* (2013.01); *H01L 29/165* (2013.01); *H01L 29/66818* (2013.01); *H01L 29/7851* (2013.01)

(58) Field of Classification Search
CPC ............... H01L 29/7853; H01L 29/165; H01L 29/66818; H01L 29/7851
See application file for complete search history.

(56) References Cited

U.S. PATENT DOCUMENTS

| | | | |
|---|---|---|---|
| 10,121,882 B1 | 11/2018 | Ho | |
| 11,682,731 B2* | 6/2023 | Bomberger | H01L 29/7851 361/748 |
| 12,021,149 B2* | 6/2024 | Bomberger | H01L 29/165 |
| 2020/0013879 A1 | 1/2020 | Li | |

(Continued)

*Primary Examiner* — Richard A Booth
(74) *Attorney, Agent, or Firm* — Schwabe, Williamson & Wyatt P.C.

(57) ABSTRACT

Fin smoothing, and integrated circuit structures resulting therefrom, are described. For example, an integrated circuit structure includes a semiconductor fin having a protruding fin portion above an isolation structure, the protruding fin portion having substantially vertical sidewalls. The semiconductor fin further includes a sub-fin portion within an opening in the isolation structure, the sub-fin portion having a different semiconductor material than the protruding fin portion. The sub-fin portion has a width greater than or less than a width of the protruding portion where the sub-fin portion meets the protruding portion. A gate stack is over and conformal with the protruding fin portion of the semiconductor fin. A first source or drain region at a first side of the gate stack, and a second source or drain region at a second side of the gate stack opposite the first side of the gate stack.

20 Claims, 13 Drawing Sheets

(56) References Cited

U.S. PATENT DOCUMENTS

| | | |
|---|---|---|
| 2020/0083357 A1 | 3/2020 | Cheng |
| 2020/0321435 A1 | 10/2020 | Ma |
| 2020/0411365 A1 | 12/2020 | Huang |
| 2022/0336633 A1 | 10/2022 | Yeoh |
| 2022/0344162 A1 | 10/2022 | Han |

* cited by examiner

FIN SMOOTHING AND INTEGRATED CIRCUIT STRUCTURES RESULTING THEREFROM

CROSS-REFERENCE TO RELATED APPLICATIONS

This application is a continuation of U.S. patent application Ser. No. 18/143,549, filed May 4, 2023, which is a continuation of U.S. patent application Ser. No. 16/700,826, filed on Dec. 2, 2019, now U.S. Pat. No. 11,682,731, issued Jun. 20, 2023, the entire contents of which are hereby incorporated by reference herein.

TECHNICAL FIELD

Embodiments of the disclosure are in the field of semiconductor devices and processing and, in particular, fin smoothing, and integrated circuit structures resulting therefrom.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1:
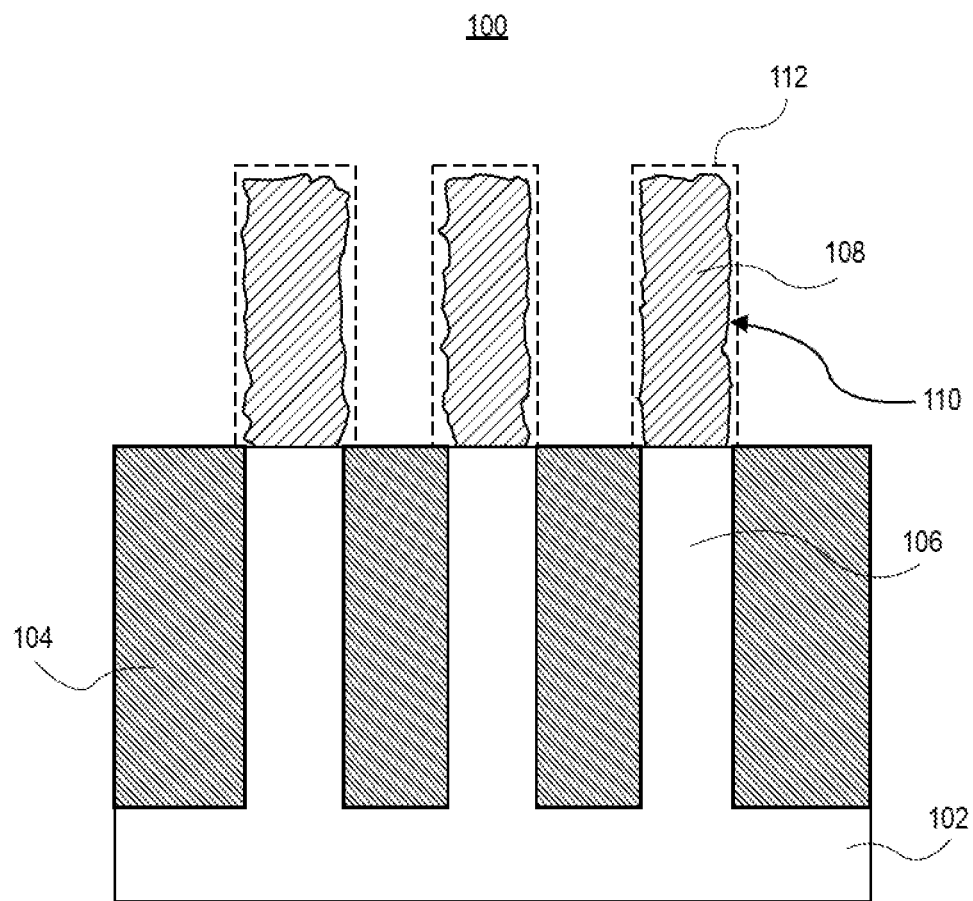
FIGS. 1-4 illustrate cross-sectional views of various operations in a method of fabricating a semiconductor fin using a fin smoothing approach, in accordance with an embodiment of the present disclosure.

Fin smoothing, and integrated circuit structures resulting therefrom, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for fin smoothing of channel semiconductor materials. One or more embodiments are directed to in-situ etch and silicon deposition processing schemes for silicon germanium, such as $Si_{70}Ge_{30}$, channels for reduced surface roughness and increased mobility. Fin architectures described herein may be implemented to improve device performance.

To provide context, during the exposition of alternative channel materials such as $Si_{70}Ge_{30}$ in preparation for interlayer deposition, high-k deposition, and gate deposition, the channel material can be attacked resulting in a rough surface with potential for a non-uniform composition on the surface. Such a non-uniform composition on the surface can result in a reduction in the mobility of the channel.

To provide further context, state-of-the-art solutions to the above issues involve either fabricating a transistor having degraded mobility, using anneals to smooth the surface, or depositing a thin silicon (Si) cap, $Si_{70}Ge_{30}$ cap, or germanium (Ge) cap. However, the use of a thermal anneal to smooth a film surface may result in either deactivation or diffusion of dopants from the source or drain regions. Additionally, the temperature required may not be compatible with other structures on the wafer during the time of the anneal. Deposition of a thin Si or Ge cap can result in a layer of Si or Ge between the high k material and the bulk of the channel, i.e., the surface of the channel is a different material than the bulk of the channel, and the high-k and gate may not be optimized to the cap material. Finally, the growth of a high quality $Si_{70}Ge_{30}$ cap has proven nearly impossible on a rough and contaminated surface.

In accordance with one or more embodiments of the present disclosure, upon exposure of a silicon germanium channel, such as a $Si_{70}Ge_{30}$ channel, a self-limiting etch is used that preferentially etches Si over Ge to clean the surface of a channel surface and provide a clean thinned fin that has a Ge-rich surface. Subsequently, without an air break, a thin layer of Si is deposited on the 'cleaned' surface. Due to the temperatures of the Si deposition and, possibly, other downstream processing temperatures, the Ge-rich surface and the thin Si layer intermix. The intermixing can result in the surface having a $Si_{70}Ge_{30}$ stoichiometry and, possibly, providing the fin back to its original width. The process can provide a very smooth and clean surface for high-k deposition.

Embodiments described herein may be implemented to provide a very smooth surface on, e.g., a $Si_{70}Ge_{30}$ channel for enhancing subsequent deposition of a high-k material and/or any intervening layers. Embodiments may be implemented to provide an increased mobility in a transistor and overall improved performance. In an embodiment, a $Si_{70}Ge_{30}$ transistor is processed as normal up to exposing a channel region for high-k gate dielectric deposition. At that point, a self-limiting etch is performed that preferentially etches Si over Ge to clean the channel. This results in a fin that has been slightly thinned, is now clean, and as a Ge rich surface. Then, in the same tool, without an air-break, a thin highly conformal Si layer is deposited on the fin. The Si layer diffuses with the Ge-rich surface resulting in a smooth $Si_{70}Ge_{30}$ surface and a fin that is back to its original width. It is to be appreciated that the etch will likely remove spacer material. However, in one embodiment, a non-selective Si deposition results in more silicon oxide growing back and possibly accounting for (i.e., replacing) spacer loss. Once the Si layer is deposited, typical gate processing can be performed.

It is to be appreciated that embodiments described herein, such as channel etch and re-deposition, can be used for both N- and P-type devices as well as for CMOS devices. Embodiments may be implemented for gate last (replacement gate) or gate first approaches. Embodiments can be implemented for a variety of architectures including, but not limited to, FinFETS, tunnel FETs (TFETs), stacked CMOS, nanowires, nanoribbons, stacked nanowires, stacked nanoribbons, and architectures where backend contacts are fabricated from the backside of the wafer though a via. In accordance with an embodiment of the present disclosure, an active channel region of a fin body is smoothed selectively after the channel is exposed post isolation recess and before replacement metal gate. The end result is a smoothed, highly scaled active fin in the active channel portion of the fin. It is also to be appreciated that embodiments described herein can be used for other compositions of SiGe. For example, if a fin is pure Si, the Si can be etched and the re-deposition process involves Si. If the fin is pure Ge, a surface layer with some Ge may result. It is to be appreciated that the correct combination of initial composition and Si thickness will result in the matched final composition. For example, if the initial composition is based on a 10% Ge channel, a relatively thinner Si layer may be implemented to achieve the final composition back to 10% Ge.

As an exemplary processing scheme, FIGS. 1-4 illustrate cross-sectional views of various operations in a method of fabricating a semiconductor fin using a fin smoothing approach, in accordance with an embodiment of the present disclosure. For FIGS. 1-4, cross-sectional views of a fin cut under a gate location are illustrated.

Referring to FIG. 1, an incoming silicon germanium (SiGe) channel is shown having surface roughness. In particular, a structure 100 includes a plurality of protruding fin portions 108 (e.g., $Si_{70}Ge_{30}$ protruding fin portions) above a substrate 102, such as a silicon substrate. An isolation structure 104 is above the substrate 102. A plurality of corresponding sub-fin portions 106 are on the substrate 102 and within corresponding openings in the isolation structure 104. In one embodiment, the sub-fin portions 106 are continuous with a corresponding protruding fin portion 108, as is depicted. The surface 110 of the protruding fin portions 108 may be relatively rough following subjection to corrosive processing operations such as removal of a dummy gate and/or dummy gate dielectric structure. Dashed lines 112 in FIG. 1 indicate a general shape of source or drain regions located into or out of the page, according to one embodiment.

Figure 2:
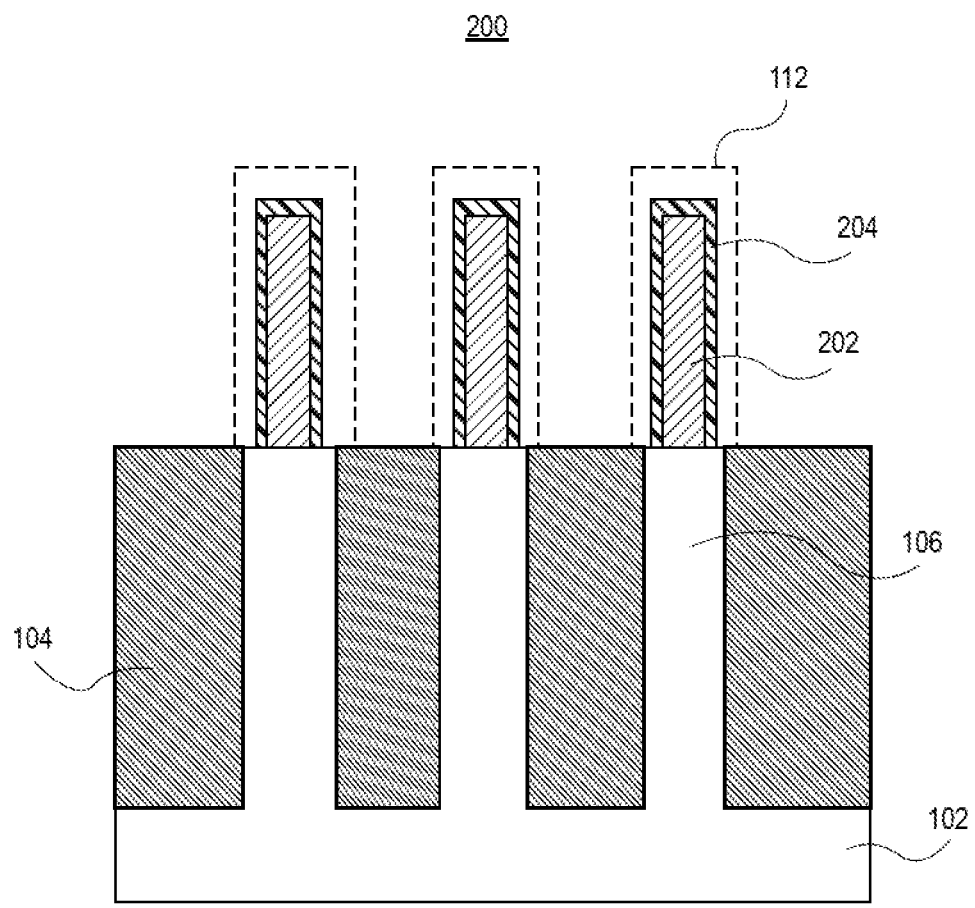

Referring to FIG. 2, a silicon germanium (SiGe) channel is depicted post in-situ etch. In particular, for structure 200, the plurality of protruding fin portions 108 of FIG. 1 is etched to provide a plurality of thinned protruding fin portions 202. In an embodiment, the plurality of protruding fin portions 108 a plurality of protruding $Si_{70}Ge_{30}$ fin portions 108, and the plurality of thinned protruding fin portions 202 is a plurality of thinned protruding $Si_{70}Ge_{30}$ fin portions 202.

Each of the plurality of thinned protruding fin portions 202 has an outer surface 204 having a composition different than a composition of the plurality of thinned protruding fin portions 202. In one embodiment, the plurality of thinned protruding fin portions 202 is a plurality of thinned protruding $Si_{70}Ge_{30}$ fin portions 202, and the outer surface 204 has relatively less silicon, i.e., $Si_XGe_{1-X}$ where X<70. In a particular such embodiment, the etch used to form the plurality of thinned protruding fin portions 202 etches silicon at a significantly greater rate that germanium. It is to be appreciated that the above described fin thinning and outer surface depletion may be performed using a dry etch or plasma etch process, a wet etch process, or a combination of a dry etch or plasma etch process and a wet etch process.

Figure 3:
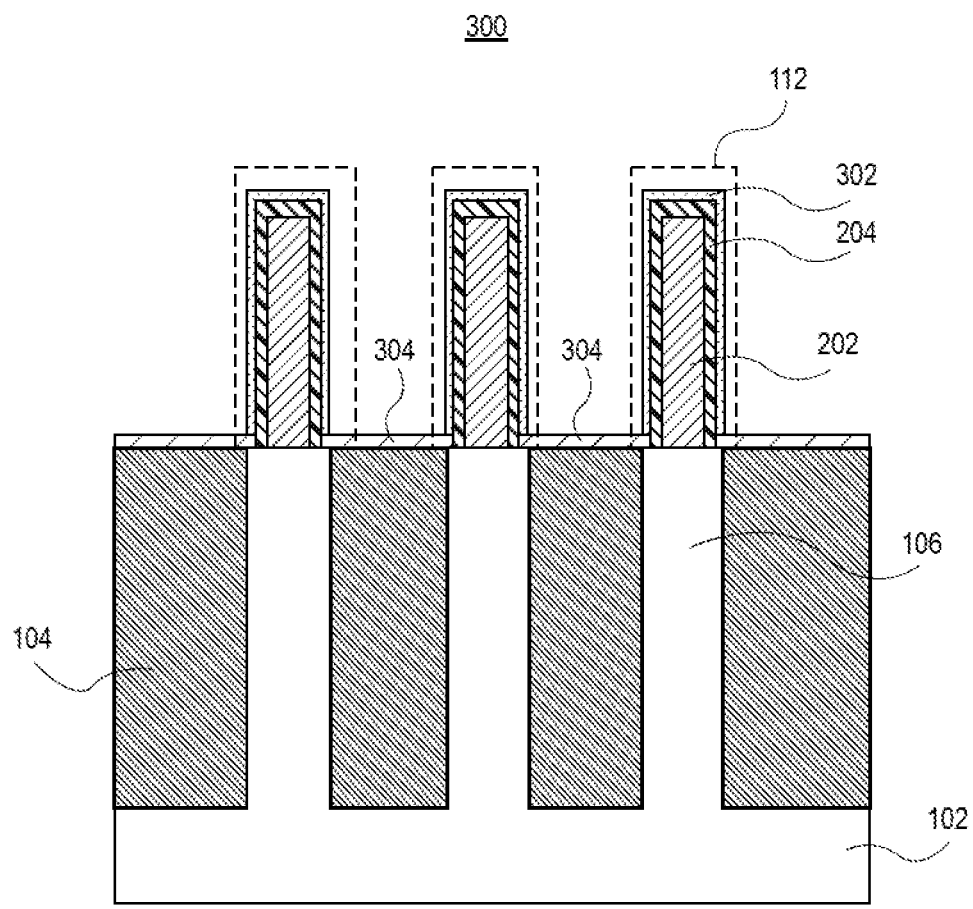

Referring to FIG. 3, a silicon germanium (SiGe) channel is depicted following a silicon deposition process. In particular, for structure 300, a silicon layer 302 is deposited on the plurality of thinned protruding fin portions 202 of FIG. 2, i.e., on the outer surface 204 of the plurality of thinned protruding fin portions 202. In one embodiment, the silicon deposition process is selective to semiconductor surfaces, and the silicon layer 302 is formed only on the outer surface 204 of the plurality of thinned protruding fin portions 202. In another embodiment, the silicon deposition process is non-selective and deposits on all surfaces of structure 200. In a particular example of the latter embodiment, a silicon layer 302 is depicted on the surfaces of the isolation structure 104 and, possibly, on gate spacers that are exposed during a replacement gate process. In one embodiment, although deposited at the same time, silicon layer 302 is crystalline while silicon layer 304 is amorphous.

Figure 4:
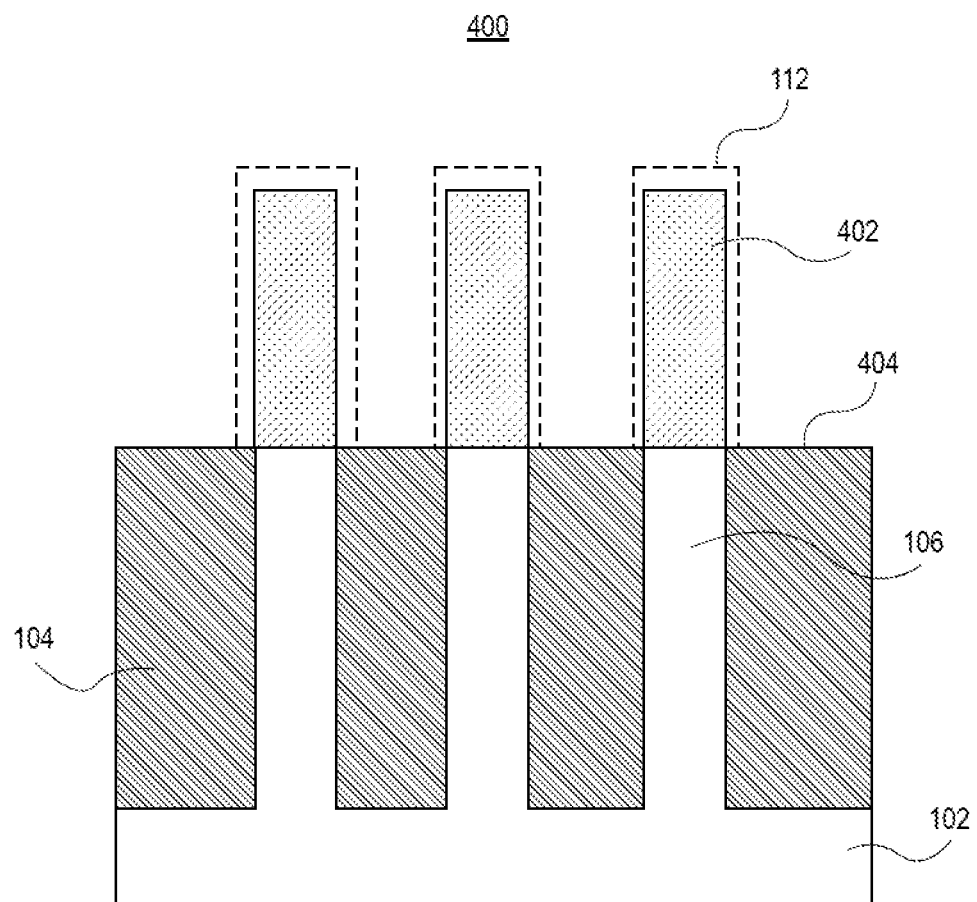

Referring to FIG. 4, a silicon germanium (SiGe) channel is depicted following an anneal process. In particular, for structure 400, upon exposure to high temperature processing, such as processing above 400 degrees Celsius, the silicon layer 302 of structure 300 diffuses with the material of the plurality of thinned protruding fin portions 202 to form a plurality of expanded protruding fin portions 402. In a particular embodiment, the silicon layer 302 of structure 300 diffuses with a plurality of thinned protruding $Si_{70}Ge_{30}$ fin portions 202, and with an outer surface 204 having a composition of $Si_XGe_{1-X}$ where X<70, to form a plurality of expanded protruding $Si_{70}Ge_{30}$ fin portions 402.

In an embodiment, each of the plurality of expanded protruding fin portions 402 have a width generally the same as the width of each of the plurality of protruding fin portions 108. However, in contrast to the plurality of protruding fin portions 108, each of the plurality of expanded protruding fin portions 402 has a smoother outer surface than the rough surface 110 of the protruding fin portions 108 of FIG. 1. In an embodiment, each of the plurality of expanded protruding fin portions 402 has substantially vertical sidewalls, as is depicted in FIG. 4.

In an embodiment, in the case that a silicon layer 304 is depicted as described in association with FIG. 3, the silicon layer 304 can be oxidized to form a silicon oxide surface layer at location 404. Such a silicon oxide surface layer may also form on gate spacers (into or out of the page) and replace some or all spacer material lost to erosion during, e.g., removal of a dummy gate in a replacement gate process.

It is to be appreciated that, in accordance with an embodiment of the present disclosure, and as described below in greater detail in association with FIGS. 6A and 6B, a gate stack can be formed over and conformal with the expanded protruding fin portions 402. In one embodiment, an initial sacrificial gate electrode structure is removed from the channel region of a semiconductor fin, the channel region is subjected to a fin smoothing process, and then a permanent gate stack is formed over the smoothed portion (channel region) of the fin. In other embodiments, the fin smoothing is performed prior to a replacement gate process. In either case, in an embodiment, a permanent gate stack ultimately formed over and conformal with the expanded protruding fin portions 402 includes a gate dielectric including a high-k dielectric material, and a gate electrode including a metal.

It is to be appreciated that, in accordance with an embodiment of the present disclosure, and as described below in greater detail in association with FIGS. 5A and 6B, source or drain structures may be formed on either side of the channel region of the above described fins, e.g., on either side of the smoothed expanded protruding fin portions 402 (source or drain regions shown as dashed lines 112). In an embodiment, a first source or drain region is at a first side of a gate stack, and a second source or drain region is at a second side of the gate stack opposite the first side of the gate stack. In one embodiment, the first and second source or drain regions are embedded source or drain regions. In another embodiment, the first and second source or drain regions are formed in regions of a semiconductor fin at the first and second sides of the gate stack, respectively. As an exemplary structure for a source or drain region or locations, FIG. 5A illustrates a cross-sectional view of a source or drain region of an integrated circuit structure, in accordance with an embodiment of the present disclosure.

Figure 5C:
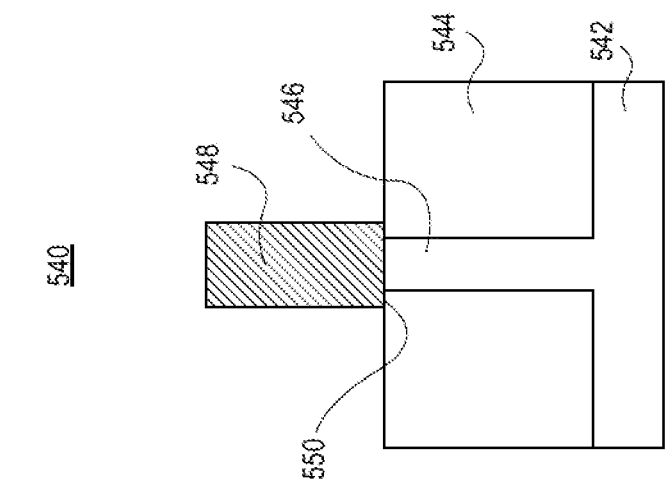
FIG. 5C illustrates a cross-sectional view of another semiconductor fin fabricated using a fin smoothing approach, in accordance with an embodiment of the present disclosure.
Figure 5B:
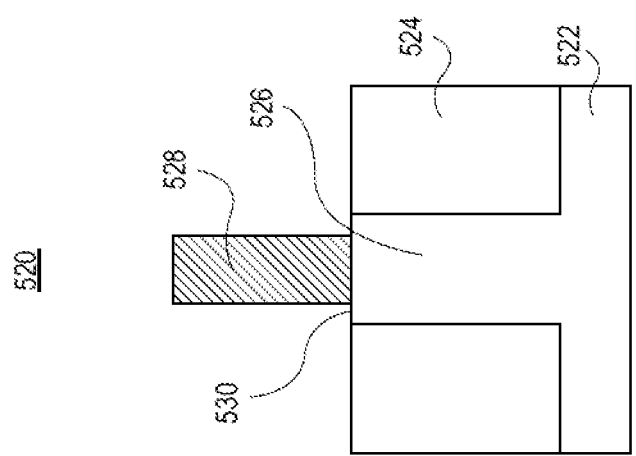
FIG. 5B illustrates a cross-sectional view of a semiconductor fin fabricated using a fin smoothing approach, in accordance with an embodiment of the present disclosure.
Figure 5A:
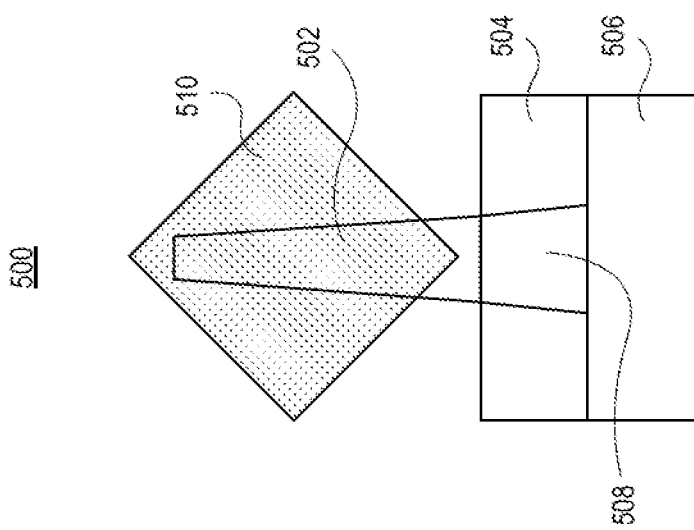
FIG. 5A illustrates a cross-sectional view of a source or drain region of an integrated circuit structure, in accordance with an embodiment of the present disclosure.

Referring to FIG. 5A, a structure 500 is shown at a source or drain location and includes a fin 502 which has not been subjected to an additional fin smoothing implementation. The fin 502 is formed above a substrate 506, such as a silicon substrate (which may be another region of substrate 102). An isolation structure 504, such as a shallow trench isolation structure, is on the substrate 506. A sub-fin portion 508 (e.g., Si or SiGe) couples the fin 502 and the substrate 506. An epitaxial structure 510 (which may be a material suitable to induce strain on a channel region) may be grown onto the fin 502 or embedded in the fin 502 at the source or drain location. For convenience of illustration, epitaxial structure 510 is depicted overlying fin 502 in order to represent both possibilities. In the formed case, epitaxial growth occurs on the top and sidewalls of the fin 502. In the latter case, a portion of the fin 502 is removed prior to growth of epitaxial structure 510. It is to be appreciated that, for a device, the structure 500 may be adjacent a channel region that has been smoothed, e.g., adjacent to one of the smoothed expanded protruding fin portions 402 of FIG. 4.

It is to be appreciated that, in some embodiments, only the channel region (e.g., and not the source or drain regions) of a protruding fin portion is smoothed according to an above smoothing approach. In other embodiments, an entire protruding portion (e.g., the channel region and the source or drain regions) is smoothed according to an above smoothing approach.

It is also to be appreciated that, in accordance with an embodiment of the present disclosure, each of the expanded protruding fin portions 402 has a width substantially the same as the corresponding the sub-fin portion 106 where the sub-fin portion 106 meets the corresponding expanded protruding fin portion 402, as is depicted in FIG. 4. However, in other embodiments, each of the expanded protruding fin portions 402 has a width different than the corresponding the sub-fin portion 106 where the sub-fin portion 106 meets the corresponding expanded protruding fin portion 402.

In a first example of differing interfacial widths of sub-fin and protruding fin portions, FIG. 5B illustrates a cross-sectional view of a semiconductor fin fabricated using a fin smoothing approach, in accordance with an embodiment of the present disclosure.

Referring to FIG. 5B, an integrated circuit structure 520 includes a semiconductor fin having an expanded protruding fin portion 528 above an isolation structure 524. The expanded protruding fin portion 528 has substantially vertical sidewalls. The semiconductor fin further includes a sub-fin portion 526 within an opening in the isolation structure 524. The sub-fin portion 526 includes a different semiconductor material than the expanded protruding fin portion 528. The sub-fin portion 526 has a width greater than a width of the expanded protruding fin portion 528 where the sub-fin portion 526 meets the expanded protruding fin portion 528. In one embodiment, the arrangement leaves exposed upper horizontal surfaces 530 of sub-fin portion 526, as is depicted.

In an embodiment, the sub-fin portion 526 includes silicon, and the expanded protruding fin portion 528 includes silicon and germanium. In one such embodiment, the sub-fin portion 526 is essentially all silicon, and the expanded protruding fin portion 528 is essentially all $Si_{70}Ge_{30}$.

In an embodiment, the sub-fin portion 526 meets the expanded protruding fin portion 528 at a location co-planar with a top surface of the isolation structure 524, as is depicted. In other embodiment, the sub-fin portion 526 meets the expanded protruding fin portion 528 at a location above or below top surface of the isolation structure 524. In an embodiment, as is depicted, the sub-fin portion 526 is on a substrate 522, such as a monocrystalline silicon substrate.

In a second example of differing interfacial widths of sub-fin and protruding fin portions, FIG. 5C illustrates a cross-sectional view of another semiconductor fin fabricated using a fin smoothing approach, in accordance with an embodiment of the present disclosure.

Referring to FIG. 5C, an integrated circuit structure 540 includes a semiconductor fin having an expanded protruding fin portion 548 above an isolation structure 544. The expanded protruding fin portion 548 has substantially vertical sidewalls. The semiconductor fin further includes a sub-fin portion 546 within an opening in the isolation structure 544. The sub-fin portion 546 includes a different semiconductor material than the expanded protruding fin portion 548. The sub-fin portion 546 has a width less than a width of the expanded protruding fin portion 548 where the sub-fin portion 546 meets the expanded protruding fin portion 548. In one embodiment, the arrangement provides overhang surfaces 550 of expanded protruding fin portion 548, as is depicted.

In an embodiment, the sub-fin portion 546 includes silicon, and the expanded protruding fin portion 548 includes silicon and germanium. In one such embodiment, the sub-fin portion 546 is essentially all silicon, and the expanded protruding fin portion 548 is essentially all $Si_{70}Ge_{30}$.

In an embodiment, the sub-fin portion 546 meets the expanded protruding fin portion 548 at a location co-planar with a top surface of the isolation structure 544, as is depicted. In other embodiment, the sub-fin portion 546 meets the expanded protruding fin portion 548 at a location above or below top surface of the isolation structure 544. In an embodiment, as is depicted, the sub-fin portion 546 is on a substrate 542, such as a monocrystalline silicon substrate.

It is to be appreciated that, in accordance with an embodiment of the present disclosure, and as described below in greater detail in association with FIGS. 6A and 6B, a gate stack can be formed over and conformal with the expanded protruding fin portions 528 or 548 of the above described semiconductor fins of FIGS. 5B and 5C, respectively. In one embodiment, an initial sacrificial gate electrode structure is removed from the channel region of a semiconductor fin, the channel region is subjected to a fin smoothing process, and then a permanent gate stack is formed over the smoothed portion (channel region) of the fin. In other embodiments, the fin smoothing is performed prior to a replacement gate process. In either case, in an embodiment, a permanent gate stack ultimately formed over and conformal with the expanded protruding fin portions 528 or 548 of the above described semiconductor fins includes a gate dielectric including a high-k dielectric material, and a gate electrode including a metal. In some embodiments, only the channel region (e.g., and not the source or drain regions) of a protruding fin portion is smoothed according to an above smoothing approach. In other embodiments, an entire protruding portion (e.g., the channel region and the source or drain regions) is smoothed according to an above smoothing approach.

In either case, in an embodiment of the structures 520 and/or 540, a first source or drain region at a first side of the gate stack, and a second source or drain region is at a second side of the gate stack opposite the first side of the gate stack. In one such embodiment, the first and second source or drain regions are embedded source or drain regions. In another such embodiment, the first and second source or drain regions are formed in regions of the semiconductor fin at the first and second sides of the gate stack, respectively.

More generally, embodiments described herein may enable the fabrication of device structures that include new channel architectures for field effect transistors (FETs) such as finFETs, trigate FETs, or nanowire FETs. One or more embodiments include devices using such channel architectures to provide reduced external resistance (Rext) and capacitance as otherwise observed for conventional finFET devices. Furthermore, improved short channel effects (e.g., reduced leakage) are achieved as otherwise observed for conventional finFET devices. One or more embodiments may be applicable for high performance, low leakage logic complementary metal oxide semiconductor (CMOS) devices. More specifically, one or more embodiments described herein are directed to approaches for forming silicon (Si)-containing non-planar architectures, although other semiconductor materials may be used in place of or together with silicon. In an embodiment one or more devices described herein may be characterized as a fin-based device, a nanoribbon-based device, a nanowire-based device, a non-planar transistor, an omega-FET, a trigate-based device, a multi-gate device, or a combination thereof.

It is to be appreciated that the structures resulting from the above exemplary processing schemes, e.g., channel structures from one or more of FIG. 4, 5B or 5C may be used in a same or similar form for subsequent processing operations to complete device fabrication, such as PMOS and NMOS device fabrication. As an example of a completed device, FIGS. 6A and 6B illustrate a cross-sectional view and a plan view (taken along the a-a' axis of the cross-sectional view), respectively, of a non-planar integrated circuit structure, in accordance with an embodiment of the present disclosure.

Figure 6A:
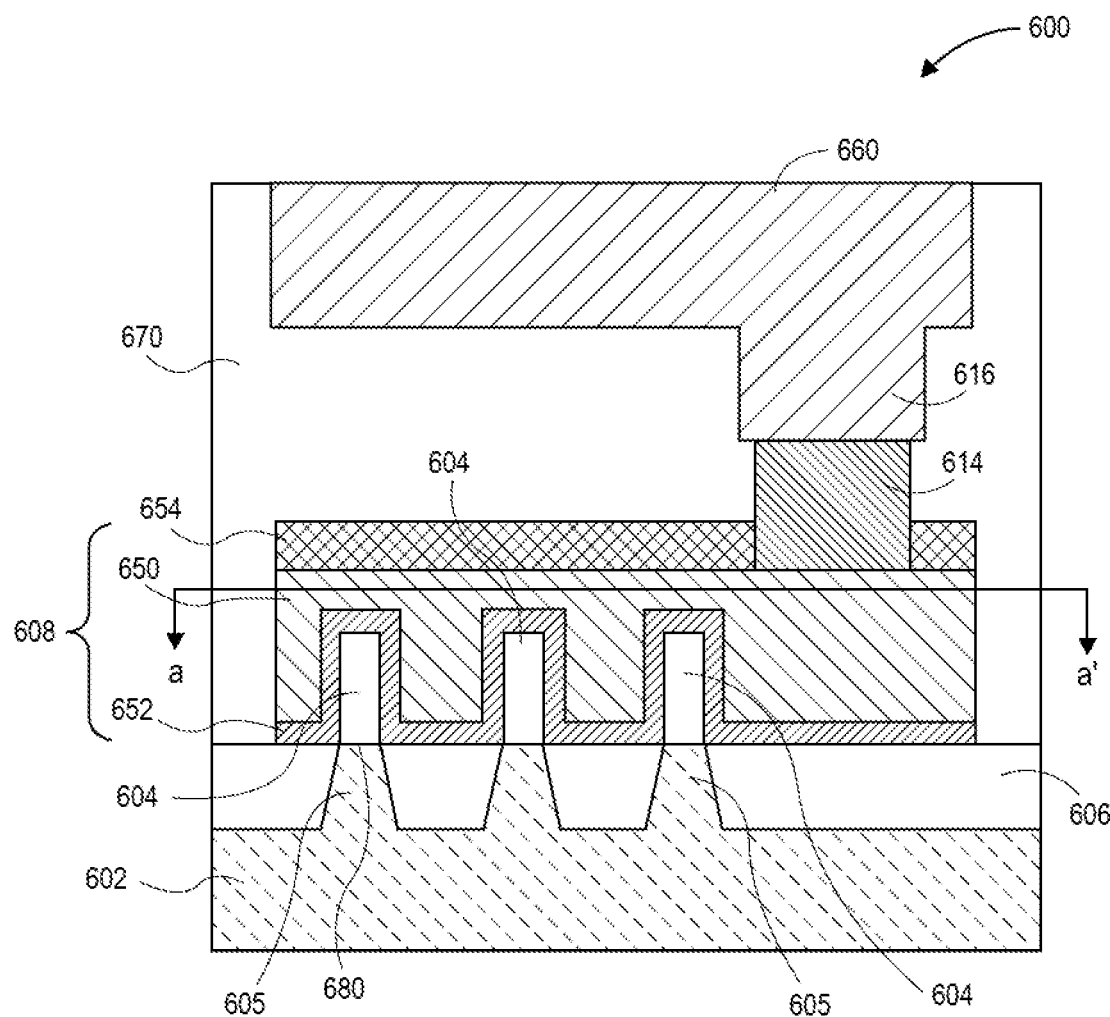
FIG. 6A illustrates a cross-sectional view of a non-planar integrated circuit structure, in accordance with an embodiment of the present disclosure.
Figure 6B:
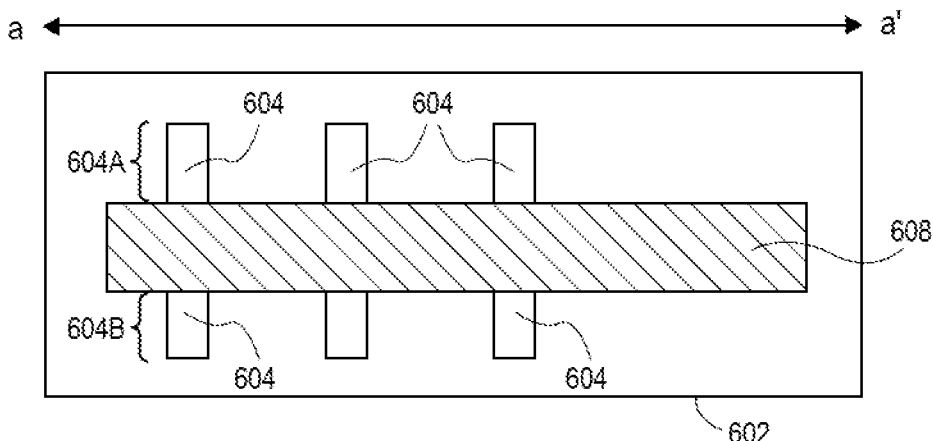
FIG. 6B illustrates a plan view taken along the a-a' axis of the non-planar integrated circuit structure of FIG. 6A, in accordance with an embodiment of the present disclosure.

Referring to FIGS. 6A and 6B, a semiconductor structure or device 600 includes a non-planar active region (e.g., a fin structure including protruding fin portion 604 and sub-fin region 605) formed on substrate 602, and within isolation region 606. A plurality of such fins may be referred to as a grating structure of semiconductor fins. A gate line 608 is over the protruding fin portions 604 of the non-planar active region as well as over a portion of the isolation region 606.

In accordance with one or more embodiments described herein, each protruding fin portion 604 is an expanded protruding fin portion 604 having substantially vertical sidewalls, as is depicted. In one such embodiment, the sub-fin region 605 has a width greater substantially the same as a width of the expanded protruding fin portion 604 where the sub-fin region 605 meets the expanded protruding fin portion 604, as illustrated in FIGS. 4 and 6A. In another such embodiment, although not depicted, the sub-fin region 605 has a width greater than a width of the expanded protruding fin portion 604 where the sub-fin region 605 meets the expanded protruding fin portion 604, as illustrated in and described in association with FIG. 5B. In yet another such embodiment, although not depicted, the sub-fin region 605 has a width less than a width of the expanded protruding fin portion 604 where the sub-fin region 605 meets the expanded protruding fin portion 604, as illustrated in and described in association with FIG. 5C.

As shown, gate line 608 includes a gate electrode 650 and a gate dielectric layer 652. In one embodiment, gate line 608 may also include a dielectric cap layer 654. A gate contact 614, and overlying gate contact via 616 are also seen from this perspective, along with an overlying metal interconnect 660, all of which are in interlayer dielectric stacks or layers 670, such as low-k dielectric materials. Also seen from the perspective of FIG. 6A, the gate contact 614 is, in one embodiment, over isolation region 606, but not over the non-planar active regions. Alternatively, in another embodiment, the gate contact 614 is over one or more of the non-planar active regions to provide a contact over active gate layout.

As is also depicted in FIG. 6A, in an embodiment, an interface 680 exists between a protruding fin portion 604 and sub-fin region 605. The interface 680 can be a transition region between a doped sub-fin region 605 and a lightly or undoped upper fin portion 604. In one such embodiment, each fin is approximately 10 nanometers wide or less, and sub-fin dopants are supplied from an adjacent solid state doping layer at the sub-fin location. It is to be appreciated that the lightly or undoped upper fin portion 604 is characterized as such with respect to N-type or P-type dopants.

Referring to FIG. 6B, the gate line 608 is shown as over the protruding fin portions 604. Although not depicted, it is to be appreciated that a plurality of gate lines may be formed to provide a grating of gate lines. Source and drain regions 604A and 604B of the protruding fin portions 604 can be seen from this perspective. In one embodiment, the source and drain regions 604A and 604B are doped portions of original material of the protruding fin portions 604. In another embodiment, the material of the protruding fin portions 604 is removed and replaced with the same or a different semiconductor material as the protruding fin portions, e.g., by epitaxial deposition to form embedded source and drain regions. In either case, the source and drain regions 604A and 604B may extend below the height of dielectric layer 606, i.e., into the sub-fin region 605. In accordance with an embodiment of the present disclosure, the more heavily doped sub-fin regions, i.e., the doped portions of the fins below interface 680, inhibits source to drain leakage through this portion of the bulk semiconductor fins.

In an embodiment, the semiconductor structure or device 600 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 608 surround at least a top surface and a pair of sidewalls of the three-dimensional body.

Substrate 602 may be composed of a semiconductor material that can withstand a manufacturing process and in which charge can migrate. In an embodiment, substrate 602 is a bulk substrate composed of a crystalline silicon, silicon/germanium or germanium layer doped with a charge carrier, such as but not limited to phosphorus, arsenic, boron, carbon, or a combination thereof, to form active region 604. In one embodiment, the concentration of silicon atoms in bulk substrate 602 is greater than 97%. In another embodiment, bulk substrate 602 is composed of an epitaxial layer grown atop a distinct crystalline substrate, e.g. a silicon epitaxial layer grown atop a boron-doped bulk silicon monocrystalline substrate. Bulk substrate 602 may alternatively be composed of a group III-V material. In an embodiment, bulk substrate 602 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 602 is composed of a group III-V material and the charge-carrier dopant impurity atoms are ones such as, but not limited to, carbon, silicon, germanium, oxygen, sulfur, selenium, beryllium or tellurium.

In accordance with one or more embodiments of the present disclosure, the fin structure including protruding fin portion 604 and sub-fin region 605 has a same semiconductor composition as substrate 602. In a particular embodiment, the substrate 602 is a monocrystalline bulk silicon substrate, and the plurality of semiconductor fins 604/605 is a plurality of silicon fins. In accordance with one or more embodiments of the present disclosure, the fin structure including protruding fin portion 604 and sub-fin region 605 has a different semiconductor composition than substrate 602. In a particular embodiment, the substrate 602 is a monocrystalline bulk silicon substrate, and the plurality of semiconductor fins 604/605 is a plurality of silicon germanium or germanium fins. In another particular embodiment, the substrate 602 is a monocrystalline bulk silicon substrate, and the plurality of semiconductor fins 604/605 is a plurality of group III-V material fins.

Isolation region 606 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 606 is composed of a dielectric material such as, but not limited to, silicon dioxide, silicon oxy-nitride, silicon nitride, or carbon-doped silicon nitride.

Gate line 608 may be composed of a gate electrode stack which includes a gate dielectric layer 652 and a gate electrode layer 650. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 602. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 614 and overlying gate contact via 616 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), providing structure 600 involves formation of a contact pattern which is essentially perfectly aligned to an existing gate pattern while eliminating the use of a lithographic operation with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 608 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 600. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 6A, the arrangement of semiconductor structure or device 600 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers may be formed by CVD, PVD, or by other deposition methods.

In an embodiment, as is used throughout the present description, lithographic operations are performed using 193 nm immersion lithography (i193), EUV and/or EBDW lithography, or the like. A positive tone or a negative tone resist may be used. In one embodiment, a trilayer mask composed of a topographic masking portion, an anti-reflective coating (ARC) layer, and a photoresist layer is used as a lithographic mask to provide a pattern of openings. In a particular such embodiment, the topographic masking portion is a carbon hardmask (CHM) layer and the anti-reflective coating layer is a silicon ARC layer.

In another aspect, it is to be appreciated that a fin depopulation (selective removal) process may be implemented for a plurality of fins prior to smoothing individual fins in the approaches described above. In a fin depopulation or selective removal process fins may be removed during hardmask patterning or by physically removing the fin. The latter approach may be described as a "fin cut" process where one or more select fins are removed using an etch process. In one embodiment, the select fins are removed to a level that leaves a protruding portion (or stub) above the substantially planar bottom surface of the fins. In another embodiment, the select fins are removed to a level approximately co-planar with the substantially planar bottom surface of the fins. In another embodiment, the select fins are removed to a level that leaves a recess below the substantially planar surface of the bottom surface of the fins.

Figure 7A:
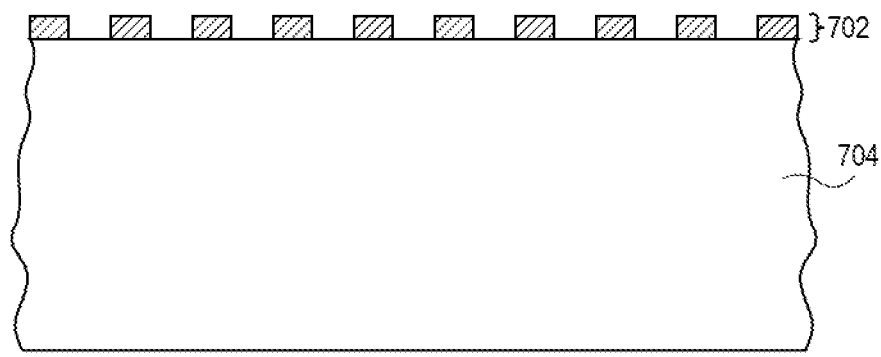
FIGS. 7A-7C cross-sectional views representing various operations in a method of fabricating a plurality of semiconductor fins, in accordance with an embodiment of the present disclosure.
Figure 7B:
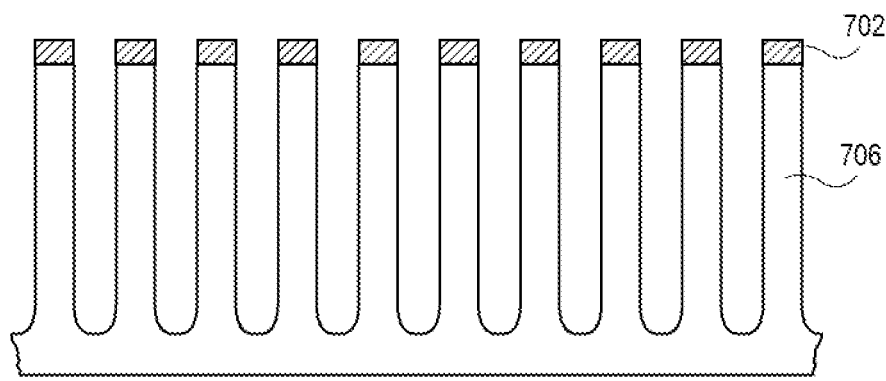
Figure 7C:
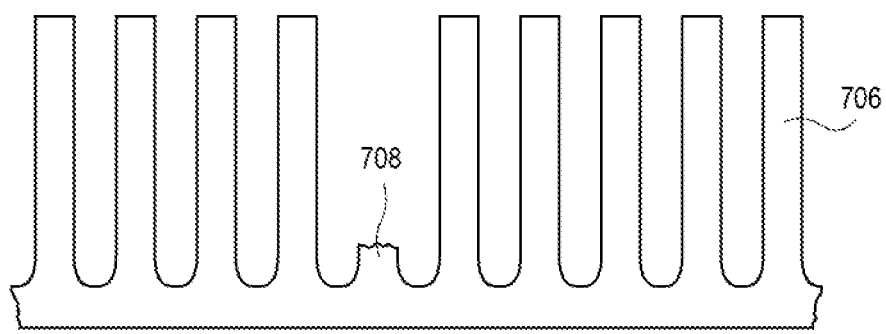

As an example of an approach based on physically removing the fin, FIGS. 7A-7C illustrate cross-sectional views representing various operations in a method of fabricating a plurality of semiconductor fins, in accordance with an embodiment of the present disclosure.

Referring to FIG. 7A, a patterned hardmask layer 702 is formed above a semiconductor layer 704, such as a bulk single crystalline silicon layer. Referring to FIG. 7B, fins 706 are then formed in the semiconductor layer 704, e.g., by a dry or plasma etch process. Referring to FIG. 7C, select fins 706 are removed, e.g., using a masking and etch process. In the example shown, one of the fins 706 is removed and may leave a remnant fin stub 708, as is depicted in FIG. 7C. In such a "fin removal last" approach, the hardmask 702 is patterned as whole to provide a grating structure without removal or modification of individual features. The fin population is not modified until after fins are fabricated.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

Figure 8A:
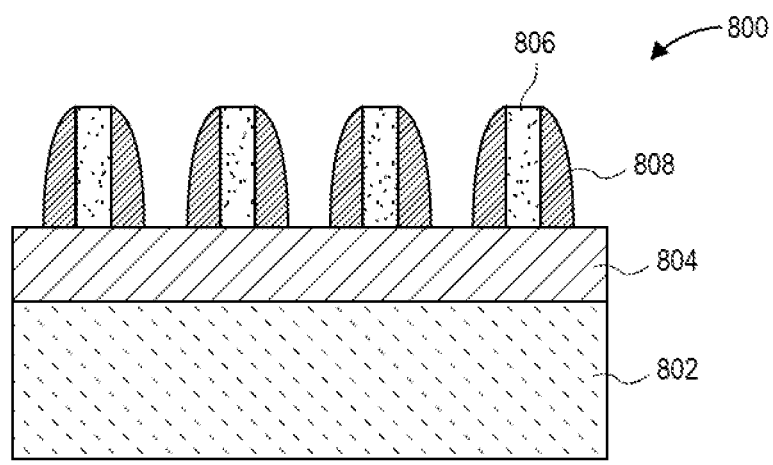
FIG. 8A illustrates a cross-sectional view of a starting structure following deposition, but prior to patterning, of a hardmask material layer formed on an interlayer dielectric (ILD) layer.
Figure 8B:
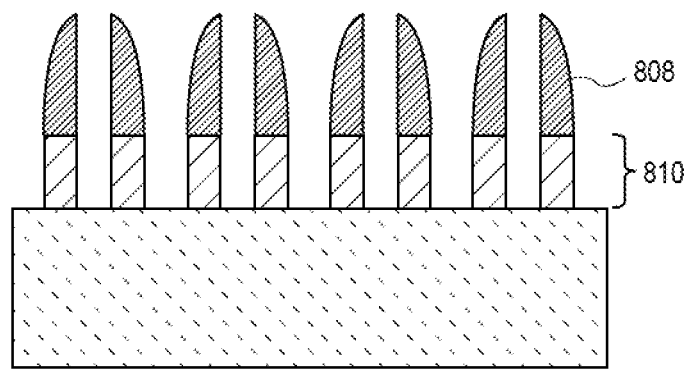
FIG. 8B illustrates a cross-sectional view of the structure of FIG. 8A following patterning of the hardmask layer by pitch halving.

In a first example, pitch halving can be implemented to double the line density of a fabricated grating structure. FIG. 8A illustrates a cross-sectional view of a starting structure following deposition, but prior to patterning, of a hardmask material layer formed on an interlayer dielectric (ILD) layer. FIG. 8B illustrates a cross-sectional view of the structure of FIG. 8A following patterning of the hardmask layer by pitch halving.

Referring to FIG. 8A, a starting structure 800 has a hardmask material layer 804 formed on an interlayer dielectric (ILD) layer 802. A patterned mask 806 is disposed above the hardmask material layer 804. The patterned mask 806 has spacers 808 formed along sidewalls of features (lines) thereof, on the hardmask material layer 804.

Referring to FIG. 8B, the hardmask material layer 804 is patterned in a pitch halving approach. Specifically, the patterned mask 806 is first removed. The resulting pattern of the spacers 808 has double the density, or half the pitch or the features of the mask 806. The pattern of the spacers 808 is transferred, e.g., by an etch process, to the hardmask material layer 804 to form a patterned hardmask 810, as is depicted in FIG. 8B. In one such embodiment, the patterned hardmask 810 is formed with a grating pattern having unidirectional lines. The grating pattern of the patterned hardmask 810 may be a tight pitch grating structure. For example, the tight pitch may not be achievable directly through selected lithography techniques. Even further, although not shown, the original pitch may be quartered by a second round of spacer mask patterning. Accordingly, the grating-like pattern of the patterned hardmask 810 of FIG. 8B may have hardmask lines spaced at a constant pitch and having a constant width relative to one another. The dimensions achieved may be far smaller than the critical dimension of the lithographic technique employed.

Accordingly, for either front-end of line (FEOL) or back-end of line (BEOL), or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

In accordance with one or more embodiments of the present disclosure, a pitch quartering approach is implemented for patterning a semiconductor layer to form semiconductor fins. In one or more embodiments, a merged fin pitch quartering approach is implemented.

Figure 9A:
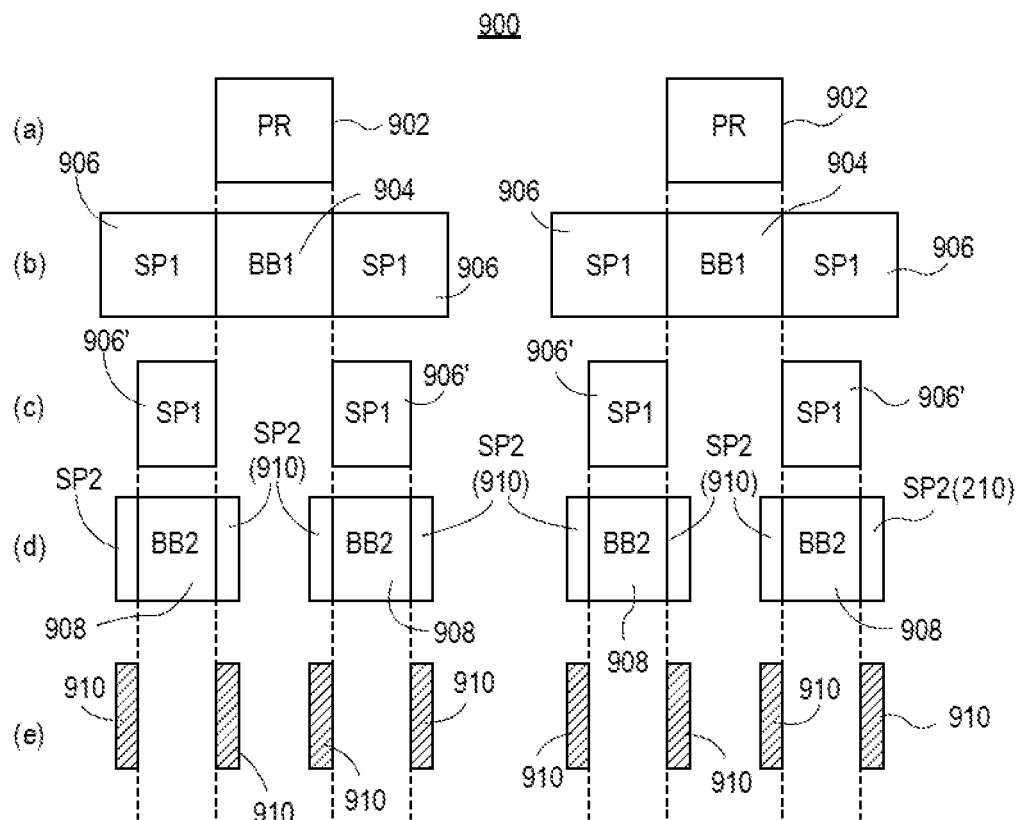
FIG. 9A is a schematic of a pitch quartering approach used to fabricate semiconductor fins, in accordance with an embodiment of the present disclosure.
Figure 9B:
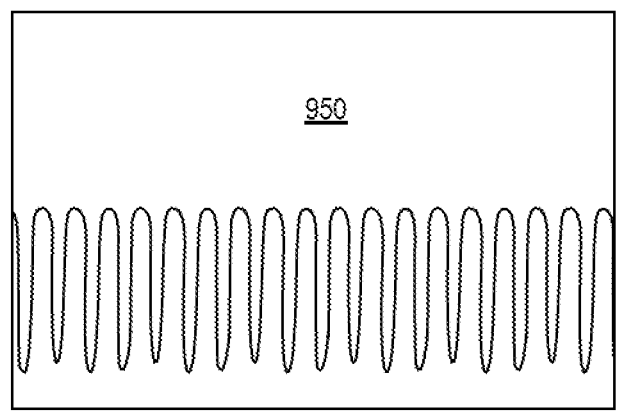
FIG. 9B illustrates a cross-sectional view of semiconductor fins fabricated using a pitch quartering approach, in accordance with an embodiment of the present disclosure.

FIG. 9A is a schematic of a pitch quartering approach 900 used to fabricate semiconductor fins, in accordance with an embodiment of the present disclosure. FIG. 9B illustrates a cross-sectional view of semiconductor fins fabricated using a pitch quartering approach, in accordance with an embodiment of the present disclosure.

Referring to FIG. 9A, at operation (a), a photoresist layer (PR) is patterned to form photoresist features 902. The photoresist features 902 may be patterned using standard lithographic processing techniques, such as 193 immersion lithography. At operation (b), the photoresist features 902 are used to pattern a material layer, such as an insulating or dielectric hardmask layer, to form first backbone (BB1) features 904. First spacer (SP1) features 906 are then formed adjacent the sidewalls of the first backbone features 904. At operation (c), the first backbone features 904 are removed to leave only the first spacer features 906 remaining. Prior to or during the removal of the first backbone features 904, the first spacer features 906 may be thinned to formed thinned first spacer features 906', as is depicted in FIG. 9A. At operation (d), the first spacer features 906 or the thinned first spacer features 906' are used to pattern a material layer, such as an insulating or dielectric hardmask layer, to form second backbone (BB2) features 908. Second spacer (SP2) features 910 are then formed adjacent the sidewalls of the second backbone features 908. At operation (e), the second backbone features 908 are removed to leave only the second spacer features 910 remaining. The remaining second spacer features 910 may then be used to pattern a semiconductor layer to provide a plurality of semiconductor fins having a pitch quartered dimension relative to the initial patterned photoresist features 902. As an example, referring to FIG. 9B, a plurality of semiconductor fins 950, such as silicon fins formed from a bulk silicon layer, is formed using the second spacer features 910 as a mask for the patterning, e.g., a dry or plasma etch patterning. In the example of FIG. 9B, the plurality of semiconductor fins 950 has essentially a same pitch and spacing throughout.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
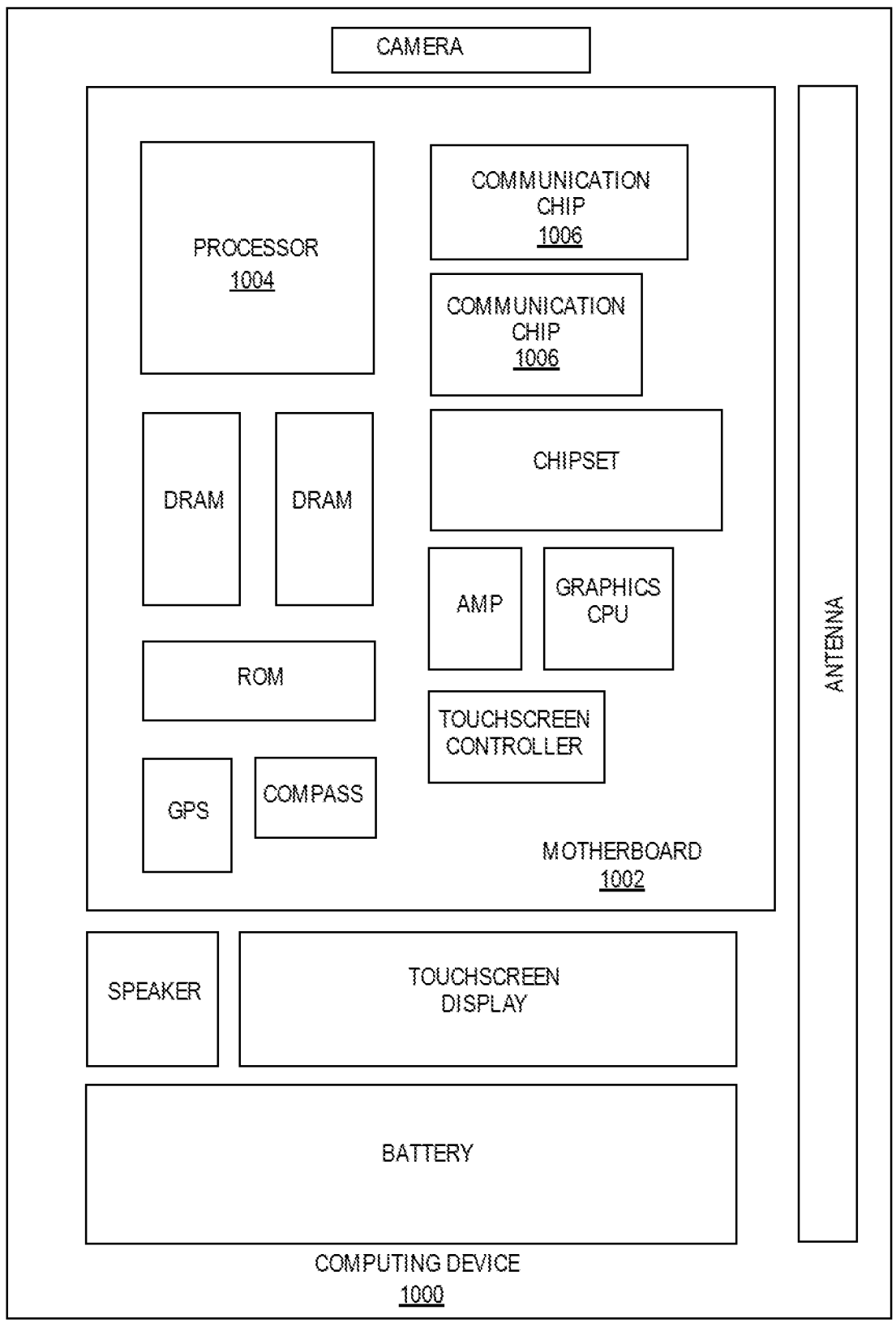
FIG. 10 illustrates a computing device in accordance with one implementation of an embodiment of the present disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the disclosure, the integrated circuit die of the processor includes one or more integrated circuit structures, such as semiconductor fins, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the disclosure, the integrated circuit die of the communication chip includes one or more integrated circuit structures, such as semiconductor fins, built in accordance with implementations of embodiments of the disclosure.

In further implementations, another component housed within the computing device 1000 may contain an integrated circuit die that includes one or more integrated circuit structures, such as semiconductor fins, built in accordance with implementations of embodiments of the disclosure.

In various embodiments, the computing device 1000 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
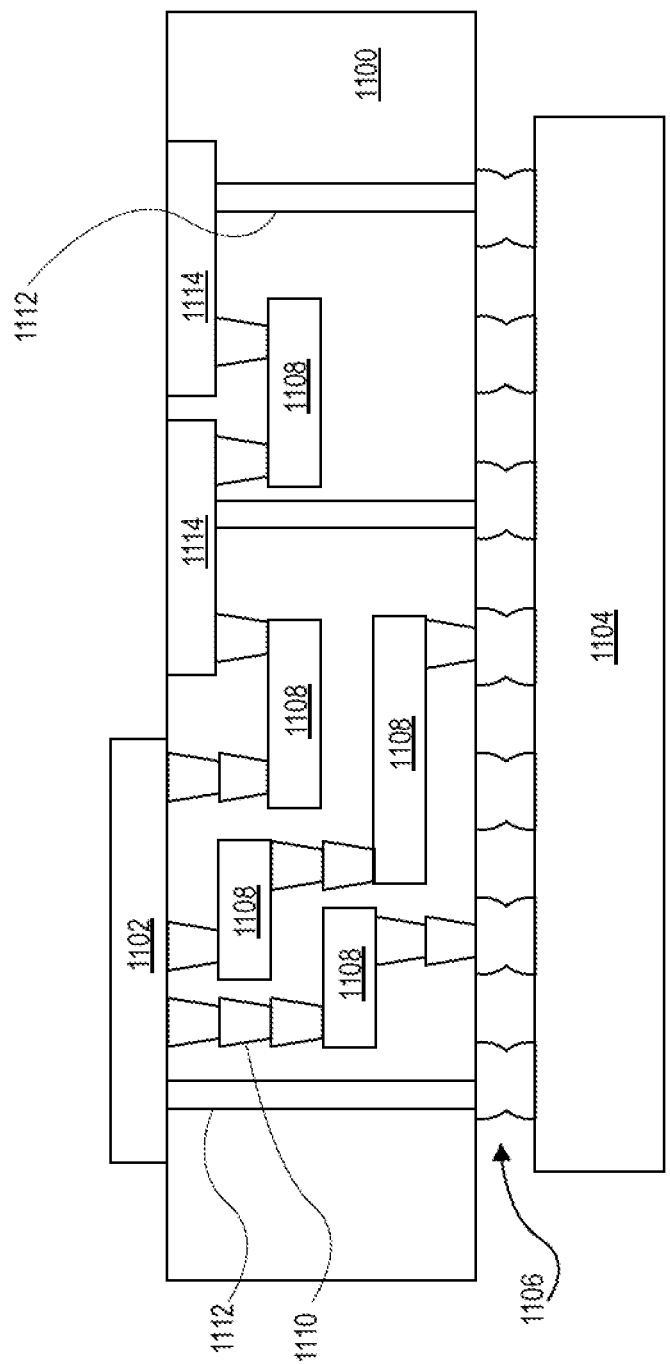
FIG. 11 illustrates an interposer that includes one or more embodiments of the present disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

In an embodiment, the first substrate 1102 is an integrated circuit die including one or more integrated circuit structures, such as semiconductor fins, built in accordance with double patterning implementations of embodiments of the disclosure. In an embodiment, the second substrate 1104 is a memory module, a computer motherboard, or another integrated circuit die including one or more integrated circuit structures, such as semiconductor fins, built in accordance with double patterning implementations of embodiments of the disclosure.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100.

Figure 12:
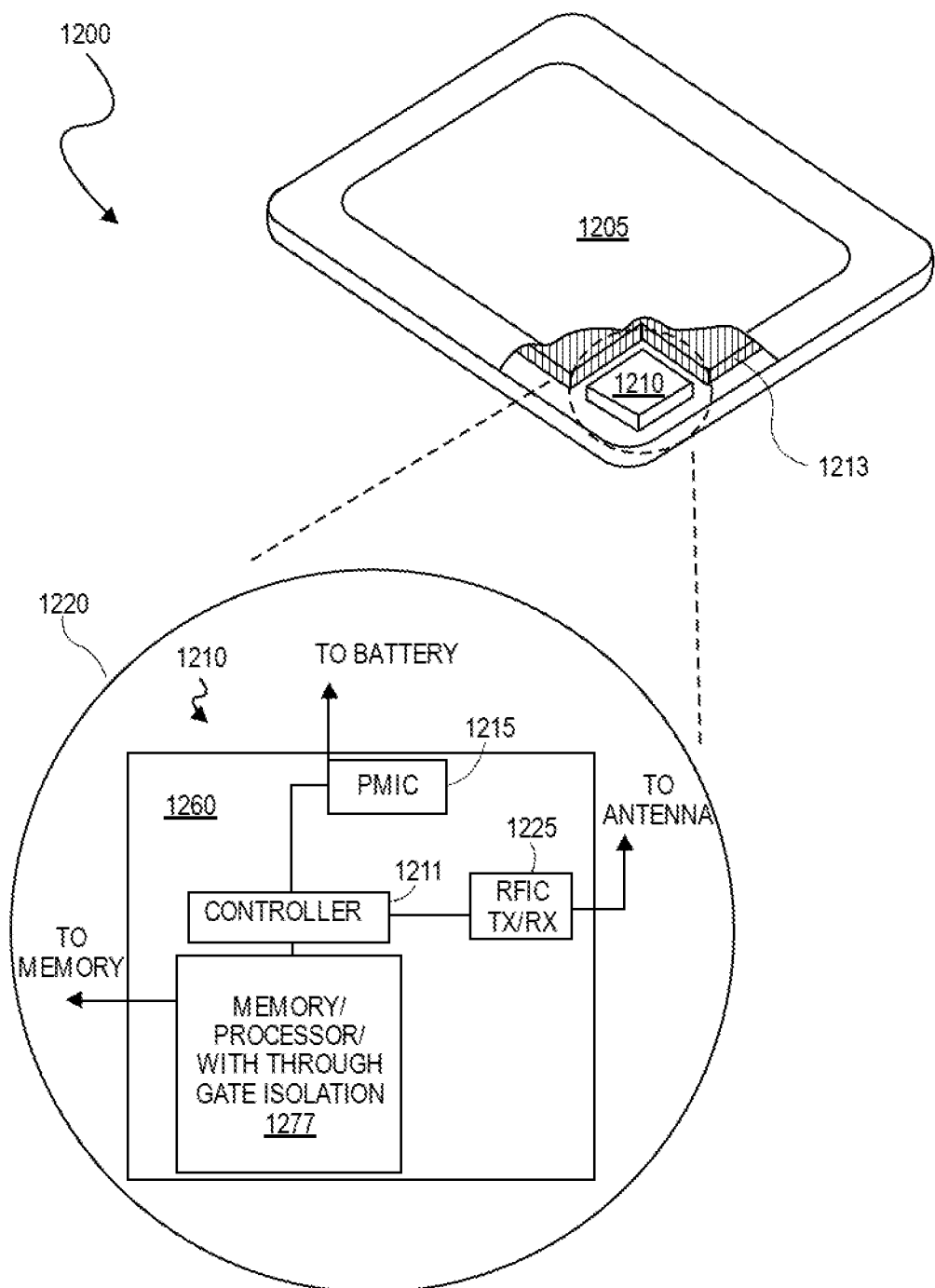
FIG. 12 is an isometric view of a mobile computing platform employing an IC fabricated according to one or more processes described herein or including one or more features described herein, in accordance with an embodiment of the present disclosure.

FIG. 12 is an isometric view of a mobile computing platform 1200 employing an integrated circuit (IC) fabricated according to one or more processes described herein or including one or more features described herein, in accordance with an embodiment of the present disclosure.

The mobile computing platform 1200 may be any portable device configured for each of electronic data display, electronic data processing, and wireless electronic data transmission. For example, mobile computing platform 1200 may be any of a tablet, a smart phone, laptop computer, etc. and includes a display screen 1205 which in the exemplary embodiment is a touchscreen (capacitive, inductive, resistive, etc.), a chip-level (SoC) or package-level integrated system 1210, and a battery 1213. As illustrated, the greater the level of integration in the system 1210 enabled by higher transistor packing density, the greater the portion of the mobile computing platform 1200 that may be occupied by the battery 1213 or non-volatile storage, such as a solid state drive, or the greater the transistor gate count for improved platform functionality. Similarly, the greater the carrier mobility of each transistor in the system 1210, the greater the functionality. As such, techniques described herein may enable performance and form factor improvements in the mobile computing platform 1200.

The integrated system 1210 is further illustrated in the expanded view 1220. In the exemplary embodiment, packaged device 1277 includes at least one memory chip (e.g., RAM), or at least one processor chip (e.g., a multi-core microprocessor and/or graphics processor) fabricated according to one or more processes described herein or including one or more features described herein. The packaged device 1277 is further coupled to the board 1260 along with one or more of a power management integrated circuit (PMIC) 1215, RF (wireless) integrated circuit (RFIC) 1225 including a wideband RF (wireless) transmitter and/or receiver (e.g., including a digital baseband and an analog front end module further includes a power amplifier on a transmit path and a low noise amplifier on a receive path), and a controller thereof 1211. Functionally, the PMIC 1215 performs battery power regulation, DC-to-DC conversion, etc., and so has an input coupled to the battery 1213 and with an output providing a current supply to all the other functional modules. As further illustrated, in the exemplary embodiment, the RFIC 1225 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1277 or within a single IC (SoC) coupled to the package substrate of the packaged device 1277.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 13:
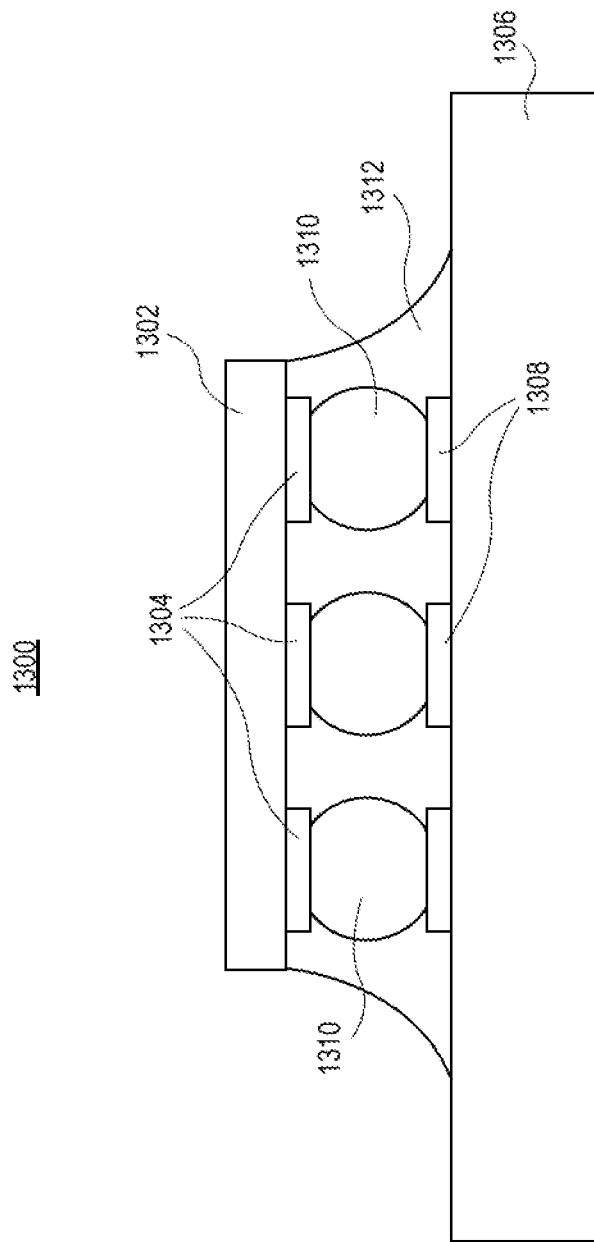
FIG. 13 illustrates a cross-sectional view of a flip-chip mounted die, in accordance with an embodiment of the present disclosure.

FIG. 13 illustrates a cross-sectional view of a flip-chip mounted die, in accordance with an embodiment of the present disclosure.

Referring to FIG. 13, an apparatus 1300 includes a die 1302 such as an integrated circuit (IC) fabricated according to one or more processes described herein or including one or more features described herein, in accordance with an embodiment of the present disclosure. The die 1302 includes metallized pads 1304 thereon. A package substrate 1306, such as a ceramic or organic substrate, includes connections 1308 thereon. The die 1302 and package substrate 1306 are electrically connected by solder balls 1310 coupled to the metallized pads 1304 and the connections 1308. An underfill material 1312 surrounds the solder balls 1310.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include fin smoothing, and integrated circuit structures resulting therefrom.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor fin having a protruding fin portion above an isolation structure, the protruding fin portion having substantially vertical sidewalls. The semiconductor fin further includes a sub-fin portion within an opening in the isolation structure, the sub-fin portion having a different semiconductor material than the protruding fin portion. The sub-fin portion has a width greater than a width of the protruding portion where the sub-fin portion meets the protruding portion. A gate stack is over and conformal with the protruding fin portion of the semiconductor fin. A first source or drain region at a first side of the gate stack, and a second source or drain region at a second side of the gate stack opposite the first side of the gate stack.

Example embodiment 2: The integrated circuit structure of example embodiment 1, wherein the sub-fin portion includes silicon, and the protruding fin portion includes silicon and germanium.

Example embodiment 3: The integrated circuit structure of example embodiment 1 or 2, wherein the protruding fin portion includes $Si_{70}Ge_{30}$.

Example embodiment 4: The integrated circuit structure of example embodiment 1, 2 or 3, wherein the sub-fin portion meets the protruding portion at a location co-planar with a top surface of the isolation structure.

Example embodiment 5: The integrated circuit structure of example embodiment 1, 2, 3 or 4, wherein the sub-fin portion is on a monocrystalline silicon substrate.

Example embodiment 6: The integrated circuit structure of example embodiment 1, 2, 3, 4 or 5, wherein the first and second source or drain regions are embedded source or drain regions.

Example embodiment 7: The integrated circuit structure of example embodiment 1, 2, 3, 4 or 5, wherein the first and second source or drain regions are formed in regions of the semiconductor fin at the first and second sides of the gate stack, respectively.

Example embodiment 8: The integrated circuit structure of example embodiment 1, 2, 3, 4, 5, 6 or 7, wherein the gate stack includes a gate dielectric including a high-k dielectric material, and a gate electrode including a metal.

Example embodiment 9: An integrated circuit structure includes a semiconductor fin having a protruding fin portion above an isolation structure, the protruding fin portion having substantially vertical sidewalls. The semiconductor fin further includes a sub-fin portion within an opening in the isolation structure, the sub-fin portion having a different semiconductor material than the protruding fin portion. The sub-fin portion has a width less than a width of the protruding portion where the sub-fin portion meets the protruding portion. A gate stack is over and conformal with the protruding fin portion of the semiconductor fin. A first source or drain region at a first side of the gate stack, and a second source or drain region at a second side of the gate stack opposite the first side of the gate stack.

Example embodiment 10: The integrated circuit structure of example embodiment 9, wherein the sub-fin portion includes silicon, and the protruding fin portion includes silicon and germanium.

Example embodiment 11: The integrated circuit structure of example embodiment 9 or 10, wherein the protruding fin portion includes $Si_{70}Ge_{30}$.

Example embodiment 12: The integrated circuit structure of example embodiment 9, 10 or 11, wherein the sub-fin portion meets the protruding portion at a location co-planar with a top surface of the isolation structure.

Example embodiment 13: The integrated circuit structure of example embodiment 9, 10, 11 or 12, wherein the sub-fin portion is on a monocrystalline silicon substrate.

Example embodiment 14: The integrated circuit structure of example embodiment 9, 10, 11, 12 or 13, wherein the first and second source or drain regions are embedded source or drain regions.

Example embodiment 15: The integrated circuit structure of example embodiment 9, 10, 11, 12 or 13, wherein the first and second source or drain regions are formed in regions of the semiconductor fin at the first and second sides of the gate stack, respectively.

Example embodiment 16: The integrated circuit structure of example embodiment 9, 10, 11, 12, 13, 14 or 15, wherein the gate stack includes a gate dielectric including a high-k dielectric material, and a gate electrode including a metal.

Example embodiment 17: A computing device includes a board. A component is coupled to the board. The component includes an integrated circuit structure including a semiconductor fin having a protruding fin portion above an isolation structure, the protruding fin portion having substantially vertical sidewalls. The semiconductor fin further includes a sub-fin portion within an opening in the isolation structure, the sub-fin portion having a different semiconductor material than the protruding fin portion. The sub-fin portion has a width greater than or less than a width of the protruding portion where the sub-fin portion meets the protruding portion. A gate stack is over and conformal with the protruding fin portion of the semiconductor fin. A first source or drain region at a first side of the gate stack, and a second source or drain region at a second side of the gate stack opposite the first side of the gate stack.

Example embodiment 18: The computing device of example embodiment 17, further including a memory coupled to the board.

Example embodiment 19: The computing device of example embodiment 17 or 18, further including a camera coupled to the board.

Example embodiment 20: The computing device of example embodiment 17, 18 or 19, further including a battery coupled to the board.

Example embodiment 21: The computing device of example embodiment 17, 18, 19 or 20, wherein the component is a packaged integrated circuit die.

Example embodiment 22: The computing device of example embodiment 17, 18, 19, 20 or 21, wherein the component is selected from the group consisting of a processor, a communications chip, and a digital signal processor.

Example embodiment 23: The computing device of example embodiment 17, 18, 19, 20, 21 or 22, wherein the computing device is selected from the group consisting of a mobile phone, a laptop, a desk top computer, a server, and a set-top box.

What is claimed is:

1. An integrated circuit structure, comprising:
   an isolation structure;
   a nanowire above the isolation structure, wherein the nanowire has a maximum lateral width along a direction perpendicular to a source to drain direction; and
   a sub-fin within an opening in the isolation structure beneath the nanowire, the sub-fin comprising a different semiconductor material than the nanowire, wherein the sub-fin comprises silicon, and the nanowire comprises silicon and germanium, and wherein the sub-fin has an uppermost surface with a width greater than the maximum lateral width of the nanowire along the direction perpendicular to the source to drain direction; and
   a gate electrode over the nanowire.

2. The integrated circuit structure of claim 1, wherein the sub-fin has exposed upper horizontal surfaces that extend laterally beyond the nanowire.

3. The integrated circuit structure of claim 1, further comprising:
   a second nanowire above the isolation structure and laterally spaced apart from the nanowire, wherein the gate electrode is over the second nanowire.

4. The integrated circuit structure of claim 3, further comprising:
   a second sub-fin within a second opening in the isolation structure beneath the second nanowire, wherein the second sub-fin comprises silicon, and the second nanowire comprises silicon and germanium.

5. The integrated circuit structure of claim 1, wherein the nanowire has substantially vertical sidewalls.

6. The integrated circuit structure of claim 5, wherein the substantially vertical sidewalls extend from a top of the nanowire to a bottom of the nanowire.

7. The integrated circuit structure of claim 1, wherein the sub-fin has tapered sidewalls.

8. The integrated circuit structure of claim 1, wherein the uppermost surface of the sub-fin is at a same level as an uppermost surface of the isolation structure.

9. The integrated circuit structure of claim 1, wherein the uppermost surface of the sub-fin is below an uppermost surface of the isolation structure.

10. The integrated circuit structure of claim 1, wherein the uppermost surface of the sub-fin is above an uppermost surface of the isolation structure.

11. A computing device, comprising:
    a board; and
    a component coupled to the board, the component including an integrated circuit structure, comprising:
      an isolation structure;
      a nanowire above the isolation structure, wherein the nanowire has a maximum lateral width along a direction perpendicular to a source to drain direction; and
      a sub-fin within an opening in the isolation structure beneath the nanowire, the sub-fin comprising a different semiconductor material than the nanowire, wherein the sub-fin comprises silicon, and the nanowire comprises silicon and germanium, and wherein the sub-fin has an uppermost surface with a width greater than the maximum lateral width of the nanowire along the direction perpendicular to the source to drain direction; and
      a gate electrode over the nanowire.

12. The computing device of claim 11, wherein the sub-fin of the integrated circuit structure has exposed upper horizontal surfaces that extend laterally beyond the nanowire.

13. The computing device of claim 11, wherein the integrated circuit structure further comprises a second nanowire above the isolation structure and laterally spaced apart from the nanowire, wherein the gate electrode of the integrated circuit structure is over the second nanowire.

14. The computing device of claim 11, further comprising:
    a memory coupled to the board.

15. The computing device of claim 11, further comprising:
    a communication chip coupled to the board.

16. The computing device of claim 11, further comprising:
    a battery coupled to the board.

17. The computing device of claim 11, further comprising:
    a camera coupled to the board.

18. The computing device of claim 11, further comprising:
    a display coupled to the board.

19. The computing device of claim 11, wherein the component is a packaged integrated circuit die.

20. The computing device of claim 11, wherein the component is selected from the group consisting of a processor, a communications chip, and a digital signal processor.

* * * * *